(12) United States Patent
Jung et al.

(10) Patent No.: US 9,874,810 B2
(45) Date of Patent: Jan. 23, 2018

(54) LAYOUT DECOMPOSITION METHODS AND SYSTEMS

(71) Applicant: Samsung Electronics Co., Ltd., Suwon-si, Gyeonggi-do (KR)

(72) Inventors: Ji-Young Jung, Hwaseong-si (KR); Dae-Kwon Kang, Yongin-si (KR); Dong-Gyun Kim, Seoul (KR); Jae-Seok Yang, Hwaseong-si (KR); Sung-Wook Hwang, Dongmyeong-myeon (KR)

(73) Assignee: Samsung Electronics Co., Ltd. (KR)

( * ) Notice: Subject to any disclaimer, the term of this patent is extended or adjusted under 35 U.S.C. 154(b) by 50 days.

(21) Appl. No.: 15/135,041

(22) Filed: Apr. 21, 2016

(65) Prior Publication Data

US 2016/0313638 A1 Oct. 27, 2016

(30) Foreign Application Priority Data

Apr. 24, 2015 (KR) ........................ 10-2015-0058010

(51) Int. Cl.
*G06F 17/50* (2006.01)
*G03F 1/70* (2012.01)
*G03F 1/68* (2012.01)

(52) U.S. Cl.
CPC . *G03F 1/70* (2013.01); *G03F 1/68* (2013.01)

(58) Field of Classification Search
CPC . G03F 1/70; G03F 7/2063; G03F 7/70; G03F 7/002; G03F 7/70433; G03F 9/00; G06F 17/5081

USPC ........................................................ 716/50, 55
See application file for complete search history.

(56) References Cited

U.S. PATENT DOCUMENTS

| | | |
|---|---|---|
| 7,617,476 B2 | 11/2009 | Hsu et al. |
| 7,861,196 B2 | 12/2010 | Huckabay et al. |
| 7,913,197 B1 | 3/2011 | Kruger et al. |
| 8,069,423 B2 | 11/2011 | Ghan et al. |
| 8,209,656 B1 | 6/2012 | Wang et al. |
| 8,347,240 B2 | 1/2013 | Agarwal et al. |
| 8,402,396 B2 | 3/2013 | Kahng et al. |
| 8,448,100 B1 | 5/2013 | Lin et al. |
| 8,484,607 B1 | 7/2013 | Tang et al. |
| 8,572,521 B2 | 10/2013 | Chen et al. |
| 8,601,409 B1 | 12/2013 | Chen et al. |
| 8,647,893 B1 | 2/2014 | Agarwal et al. |
| 8,689,151 B1 | 4/2014 | Agarwal et al. |

(Continued)

*Primary Examiner* — Paul Dinh
(74) *Attorney, Agent, or Firm* — Myers Bigel, P.A.

(57) ABSTRACT

A layout decomposition method is provided which may include building, a graph including a plurality of nodes and edges from a layout design including a plurality of polygons, wherein the nodes correspond to the polygons of the layout design and the edges identify two nodes disposed close to each other at a distance shorter than a minimum distance among the plurality of nodes, comparing degrees of the plurality of nodes with a reference value, selecting a target node, the degree of which exceeds the reference value, identifying a first and second subgraph based on the target node, performing multi-patterning technology decomposition on the first and second subgraph to acquire a first and second result, and creating first mask layout data corresponding to one portion of the layout design and second mask layout data corresponding to the other portion of the layout design by combining the first and second result.

20 Claims, 8 Drawing Sheets

(56) References Cited

U.S. PATENT DOCUMENTS

| | | |
|---|---|---|
| 8,694,945 B2 | 4/2014 | Wang et al. |
| 8,713,491 B2 | 4/2014 | Chen et al. |
| 8,745,556 B2 | 6/2014 | Chen et al. |
| 2010/0191357 A1* | 7/2010 | Maeda ................ G06F 17/5068 700/97 |
| 2012/0196230 A1* | 8/2012 | Cho ................... G03F 7/70433 430/319 |
| 2014/0282293 A1* | 9/2014 | Lin .................... G06F 17/5081 716/52 |
| 2015/0052490 A1* | 2/2015 | Cilingir .................... G03F 1/36 716/52 |

* cited by examiner

LAYOUT DECOMPOSITION METHODS AND SYSTEMS

CROSS-REFERENCE TO RELATED APPLICATION

This application claims priority under 35 U.S.C. §119 to Korean Patent Application No. 10-2015-0058010 filed on Apr. 24, 2015 in the Korean Intellectual Property Office, the contents of which is incorporated herein by reference in their entirety.

BACKGROUND

1. Technical Field

The present inventive concept relates to layout decomposition methods and layout decomposition systems for manufacturing semiconductor devices.

2. Description of the Related Art

Miniaturization and integration of processes for manufacturing a semiconductor device have been gradually increasing. Accordingly, in a process of manufacturing a semiconductor device of 20 mm or less, multi-patterning technologies (MPT) including double patterning technologies (DPT) or triple patterning technologies (TPT) have been used as an alternative to extreme ultra violet (EUV), due to limitations in an exposure process.

SUMMARY

Aspects of the present inventive concepts may provide layout decomposition methods, capable of promptly and efficiently processing multi-patterning technology (MPT) decomposition.

Other aspects of the present inventive concepts may provide layout decomposition systems, capable of promptly and efficiently processing MPT decomposition.

However, aspects of the present inventive concepts are not restricted to those set forth herein. The above and other aspects of the present inventive concepts will become more apparent to one of ordinary skill in the art to which the present inventive concepts pertain by referencing the detailed description of the present inventive concepts provided herein.

According to aspects of the present inventive concepts, a layout decomposition method may include building a graph including a plurality of nodes and a plurality of edges from a layout design including a plurality of polygons, wherein respective ones of the plurality of nodes correspond to respective ones of the plurality of polygons of the layout design and respective ones of the plurality of edges identify two nodes disposed close to each other at a distance less than a predetermined minimum distance among the plurality of nodes, comparing degrees of respective ones of the plurality of nodes with a predetermined reference value, selecting a target node, the degree of which exceeds the predetermined reference value, from among the plurality of nodes, identifying a first subgraph and a second subgraph based on the target node, from the graph, performing multi-patterning technology (MPT) decomposition on each of the first subgraph and the second subgraph to acquire a first result and a second result, and creating first mask layout data corresponding to a first portion of the layout design and second mask layout data corresponding to a second portion of the layout design by combining the first result and the second result.

According to other aspects of the present inventive concepts, a layout decomposition method may include building a graph including a plurality of nodes and a plurality of edges from a layout design including a plurality of polygons, wherein respective ones of the plurality of nodes correspond to respective ones of the plurality of polygons of the layout design and respective ones of the plurality of edges identify two nodes disposed close to each other at a distance less than a predetermined minimum distance among the plurality of nodes, selecting a target node, a degree of which exceeds a predetermined reference value, from among the plurality of nodes, identifying a first subgraph and a second subgraph based on the target node, from the graph, performing multi-patterning technology (MPT) decomposition on the first subgraph in parallel with performing MPT decomposition on the second subgraph, and forming a first mask and a second mask for performing an MPT lithography process using the result of the MPT decomposition on the first subgraph and the MPT decomposition on the second subgraph.

According to other aspects of the present inventive concepts, a layout decomposition method may include fetching a layout design including a plurality of polygons from a non-transitory computer-readable medium, building a graph including a plurality of nodes and a plurality of edges from the layout design to store the graph in a memory, wherein respective ones of the plurality of nodes correspond to respective ones of the plurality of polygons of the layout design and respective ones of the plurality of edges identify two nodes disposed close to each other at a distance less than a predetermined minimum distance among the plurality of nodes, analyzing the graph to create a list of nodes, degrees of which exceed a predetermined reference value, splitting the graph into a plurality of subgraphs based on the list of nodes, performing MPT decomposition on ones of the plurality of subgraphs to acquire a plurality of coloring results, performing coloring on the graph by combining the plurality of coloring results, and classifying the plurality of polygons into a plurality of groups according to colors imparted to the plurality of nodes of the graph.

BRIEF DESCRIPTION OF DRAWINGS

The above and other aspects and features of the present inventive concepts will become more apparent by describing in detail example embodiments thereof with reference to the attached drawings, in which.

DETAILED DESCRIPTION

Figure 1:
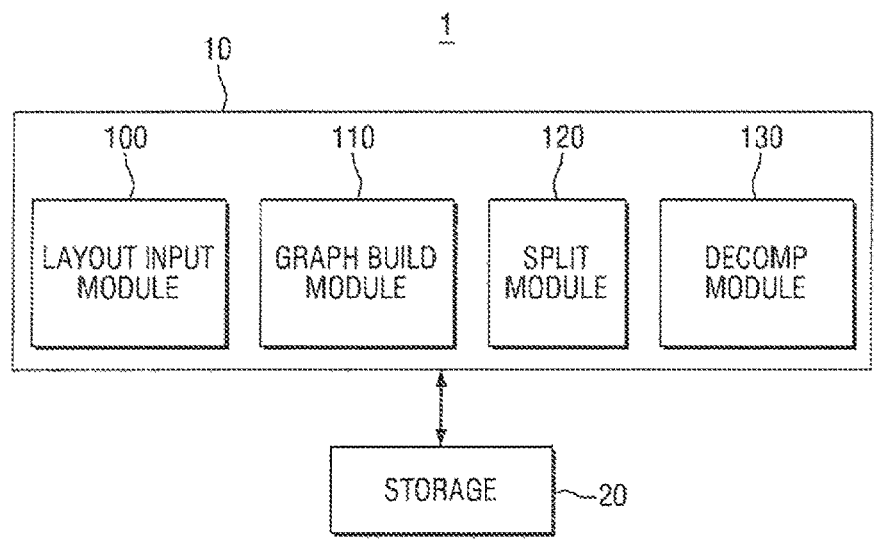
FIG. 1 is a diagram illustrating a layout decomposition system according to example embodiments of the present inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concept of the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "under," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, it will be understood that when an element or layer is referred to as being "on," "connected to," "coupled to," or "adjacent to" another element or layer, it can be directly on, connected, coupled, or adjacent to the other element or layer, or intervening elements or layers may be present, in contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram illustrating a layout decomposition system according to example embodiments of the present inventive concepts.

Referring to FIG. 1, a layout decomposition system 1 according to example embodiments of the present inventive concepts may include a layout input module 100, a graph build module 110, a graph split module 120, and a decomposition module 130.

The layout input module 100 may receive a layout design including a plurality of polygons from the outside. The layout design indicating a circuit description or a logical description of a circuit, for example, an integrated circuit, as a geometric description may include circuit components, an interconnection connecting the circuit components to each other, and the like, in the specification, geometries included in the layout design and corresponding to various physical circuit components are referred to as polygons or circuit patterns. In some example embodiments of the present inventive concepts, the layout input module 100 may receive the layout design in a data file format capable of being manipulated by a computer or software (for example, an electronic design automation (EDA) tool).

The graph build module 110 may read and analyze the layout design received from the layout input module 100 to build a graph including a plurality of nodes and edges corresponding to the layout design. Here, the nodes may correspond to polygons of the layout design, and the edges may identify two nodes disposed close to each other at a distance shorter than a predetermined minimum distance among the plurality of nodes. For example, on the assumption that a first polygon and a second polygon adjacent to each other in the layout design may correspond to a first node and a second mode, and design rules applied to the layout design have constraint conditions on a minimum distance between circuit patterns, in the case that a distance between the first polygon and the second polygon does not satisfy the constraint conditions specified in the design rules, an edge may be formed between the first node and the second node. In such a manner, the graph build module 110 may build a graph corresponding to the layout design received from the layout input module 100.

The graph split module 120 may analyze the graph built by the graph build module 110 and may split the graph into a plurality of subgraphs based on a node, a degree of which exceeds a predetermined reference value. Here, the term "degree," a characteristic value of a specific node, refers to the number of edges of the node. For example, in the case that the node has 10 edges, a degree of the node may be 10. In some example embodiments of the present inventive concepts, a degree of a specific node may be set to be any value in proportion to the number of edges of the node. A concrete process of splitting the graph by the graph split module 120 based on a degree of a node will be described later with reference to FIG. 5.

The decomposition module 130 may perform multi-patterning technology (MPT) decomposition on each of the plurality of subgraphs split by the graph split module 120. Here, MPT decomposition may be performed in such a manner as to impart colors to nodes included in the respective subgraphs. Specifically, different colors may be imparted to two nodes sharing a common edge in a specific subgraph. By repeating such a process, even any two nodes sharing a common edge in a single subgraph may not be allowed to have a common color and the nodes of the subgraphs may be classified by colors, thereby belonging to different groups. For example, a first mask used in multi-patterning technology (MPT) lithography may be manufactured from circuit patterns or polygons corresponding to nodes belonging to a first group and a second mask used in MPT lithography may be manufactured from circuit patterns or polygons corresponding to nodes belonging to a second group.

In particular, the decomposition module 130 may combine a plurality of coloring results obtained by performing MPT decomposition on each of the plurality of subgraphs and may perform coloring on the entirety of the graph before the graph is split by the graph split module 120. In addition, after the decomposition module 130 performs coloring on the entire graph, the decomposition module 130 may classify a plurality of polygons into a plurality of groups according to colors imparted to the nodes of the graph.

The layout design received by the layout input module 100, the graph built by the graph build module 110 from the layout design, the plurality of subgraphs split by the graph split module 120, the plurality of subgraphs created by the decomposition module 130 or the coloring results (including an intermediate result), and the like may be stored in data file formats capable of being manipulated by a computer or software (for example, an electronic design automation tool), in a temporary computer-readable medium (for example, random access memory (RAM)) or a non-transitory computer-readable medium (for example, a storage 20).

Figure 2:
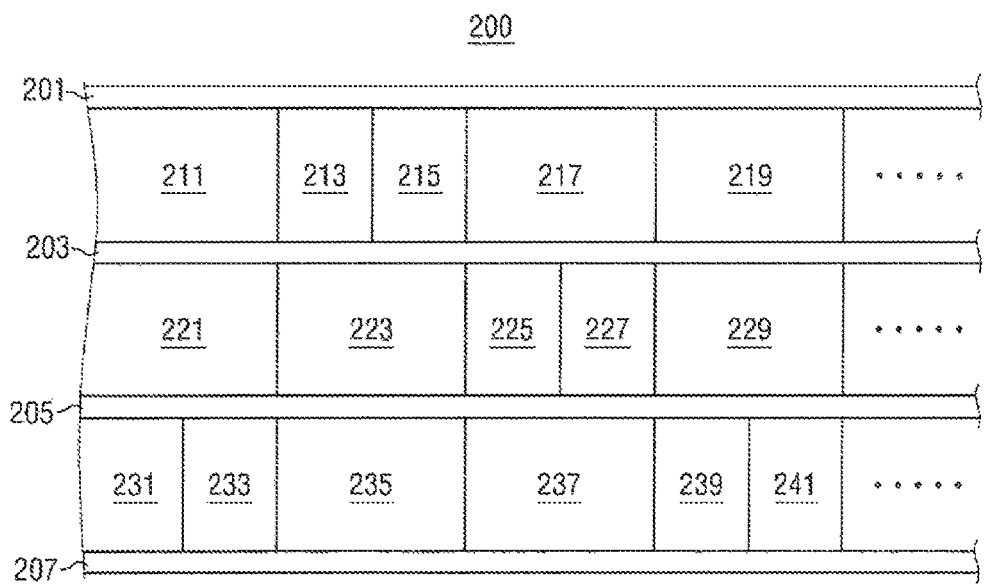
FIG. 2 is a diagram illustrating standard cells included in a layout design.
Figure 3:
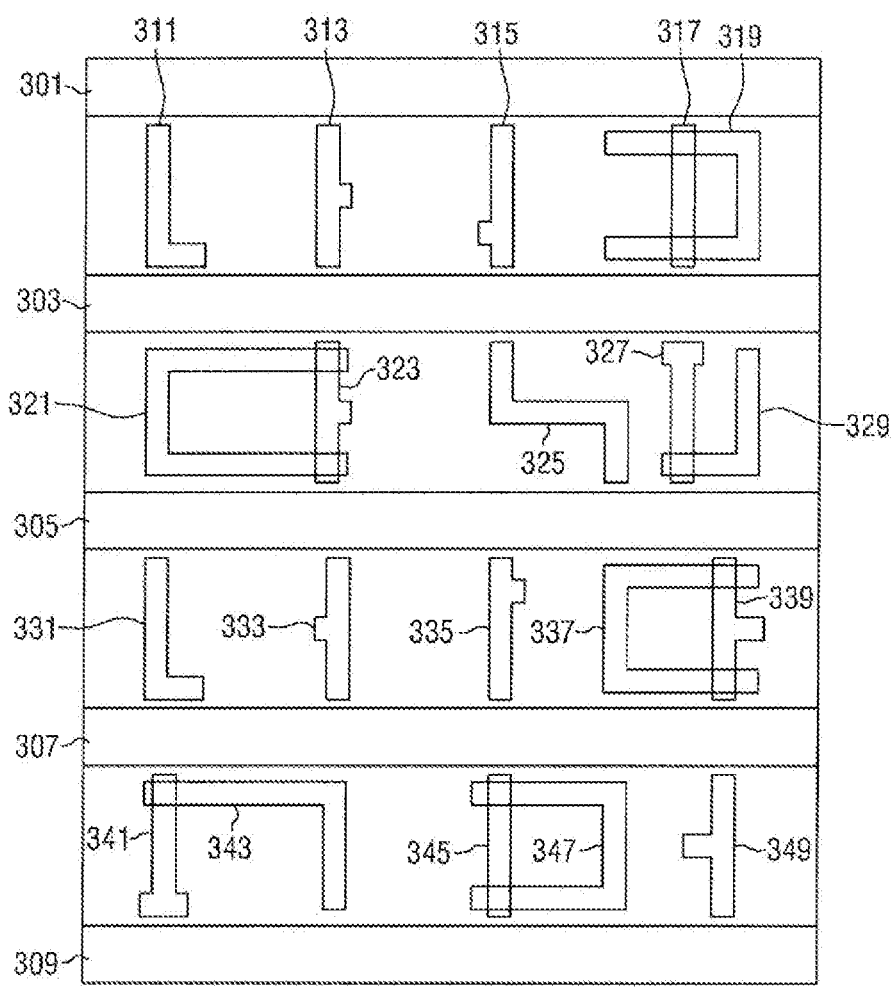
FIG. 3 is a diagram illustrating the layout design including a plurality of polygons.

FIG. 2 is a diagram illustrating standard cells included in a layout design. FIG. 3 is a diagram illustrating the layout design including a plurality of polygons.

Referring to FIG. 2, a layout design 200 may include a plurality of standard cells 211 to 241. The standard cells may modularize a circuit implementing specific functions and may be used to configure a circuit implementing more complex functions. For example, the standard cells may implement a unit circuit able to perform logical operations AND, OR, NAND, NOR, INV and the like. In the case that the layout design 200 requires an AND circuit and an INV circuit, a design may be prepared by only disposing the standard cell 211 on which logical operation AND has been implemented in advance and the standard cell 213 on which logical operation INV has been implemented in advance, in the layout design 200.

In the case that the layout design 200 is to design a chip having a relatively large size, the layout design 200 may include the plurality of standard cells 211 to 241 as in FIG. 2 while the plurality of standard cells 211 to 241 may be arranged in regions divided by power rails 201, 203, 205 and 207.

As illustrated in FIG. 3, when the layout design 200 of FIG. 2 is shown by magnifying a portion of the layout design 200, the layout design 200 may include a plurality of power rails 301, 303, 305, 307 and 309 and a plurality of circuit patterns disposed between the power rails 301, 303, 305, 307 and 309, that is, polygons 311 to 349. For example, the polygons 311 to 319 may be disposed between the power rails 301 and 303, and a distance between the polygon 311 and the power rail 301 may not satisfy constraint conditions specified in design rules. In addition, a distance between the polygon 317 and the polygon 319 may be outside of the constraint conditions specified in the design rules. Then, in FIG. 4, on the assumption that distances between the plurality of power rails 301, 303, 305, 307 and 309 and the polygons 311 to 349 disposed between the power rails 301, 303, 305, 307 and 309 do not satisfy the constraint conditions specified in the design rules applied to the layout design 200, a process of building a graph using the graph build module 110 will be described.

Although the terms of the power rails 301, 303, 305, 307 and 309 and the polygons 311 to 349 disposed between the power rails 301, 303, 305, 307 and 309 are classified and used in the example embodiments, a person having ordinary skill in the art may understood that the power rails 301, 303, 305, 307 and 309 are also components configuring a circuit and thus, correspond to the polygons.

Figure 4:
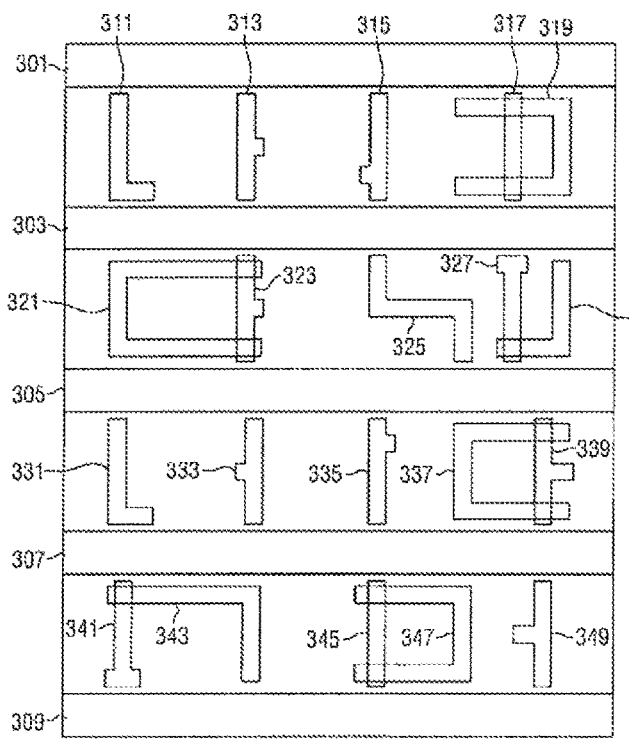
FIG. 4 is a diagram illustrating building a graph by a layout decomposition method according to example embodiments of the present inventive concepts.
Figure 4:
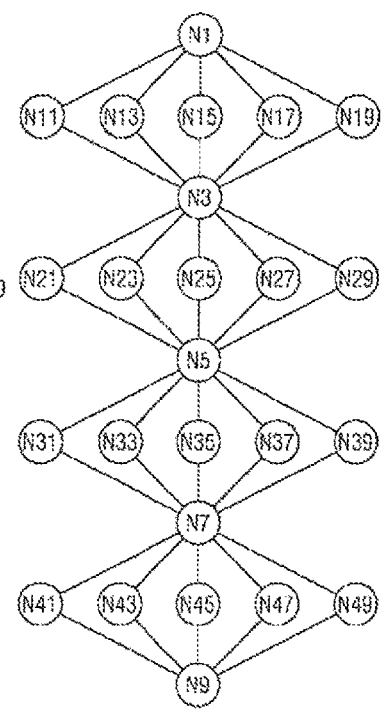

FIG. 4 is a diagram illustrating building a graph by a layout decomposition method according to example embodiments of the present inventive concepts.

Referring to FIG. 4, the graph build module 110 may build nodes N1 to N49 corresponding to the polygons 301 to 349 of the layout design. For example, the nodes N1 N3, N5, N7 and N9 may correspond to the polygons 301, 303, 305, 307 and 309, respectively, and the nodes N11, N13, N15, N17 and N19 may correspond to the polygons 311, 313, 315, 317 and 319, respectively.

Then, the graph build module 110 may inspect whether the polygons 301 to 349 satisfy the constraint conditions specified in the design rules applied to the layout design and may identify two polygons disposed at a distance that does not satisfy the constraint conditions specified in the design rules. As described above, assuming that distances between the polygons 301, 303, 305, 307 and 309 and the polygons 311 to 349 disposed therebetween do not satisfy the constraint conditions, the graph build module 110 may form edges between the nodes N1 to N49 as in FIG. 4. For example, since a distance between the polygon 301 and the polygon 311 does not satisfy the constraint conditions, an edge may be formed between the node N1 and the node N11. Since a distance between the polygon 309 and the polygon 343 does not satisfy the constraint conditions, an edge may be formed between the node N9 and the node N43. In the case that a distance between the polygon 317 and the polygon 319 does not satisfy the constraint conditions, an edge may be formed between the node N17 and the node N19.

The graph built in such a manner may be used to form a pattern on a semiconductor wafer using MPT lithography. For example, in the case of using double patterning technology (DPT), two colors may be imparted to nodes configuring a graph while different colors (that is, a first color and a second color) may be imparted to two nodes connected to each other by a common edge, and a first mask including a polygon corresponding to the node to which the first color is imparted and a second mask including a polygon corresponding to the node to which the second color is imparted may be manufactured. In the case that a lithography process is performed on a semiconductor wafer using the second mask after the lithography process is performed using the first mask, further fine patterns may be formed. As another example, in the case of using triple patterning technology (TPT), three colors may be imparted to nodes configuring a graph while different colors (that is, two colors among a first color, a second color and a third color) may be imparted to two nodes connected to each other by a common edge, and a first mask including a polygon corresponding to the node to which the first color is imparted, a second mask including a polygon corresponding to the node to which the second color is imparted, and a third mask including a polygon corresponding to the node to which the third color is imparted may be manufactured. In the case that a lithography process is performed on a semiconductor wafer using the second mask and subsequently, is performed using the third mask after the lithography process is performed using the first mask, further fine patterns may be formed.

However, in order to manufacture a chip having a relatively large size as in the layout design shown in FIGS. 3 and 4, a relatively long time may be required to perform a coloring operation of the graph corresponding to the layout design. For example, in a graph including n nodes, time required for performing coloring for MPT decomposition using k types of colors may be expected by the following equation.

$$Pn = k \times (k-1)^{n-1}$$

Here, Pn means the number of cases for coloring using k types of colors in the graph including a nodes. According to this, the number of cases for coloring using three types of colors in a graph including 25 nodes is significantly large as follows.

$$Pn = 3 \times (3-1)^{25-1} = 50331648$$

In order to solve the limitations, the layout decomposition method and the layout decomposition system according to various example embodiments of the present inventive concepts may use the graph split module 120 splitting the graph built by the graph build module 110.

Figure 5:
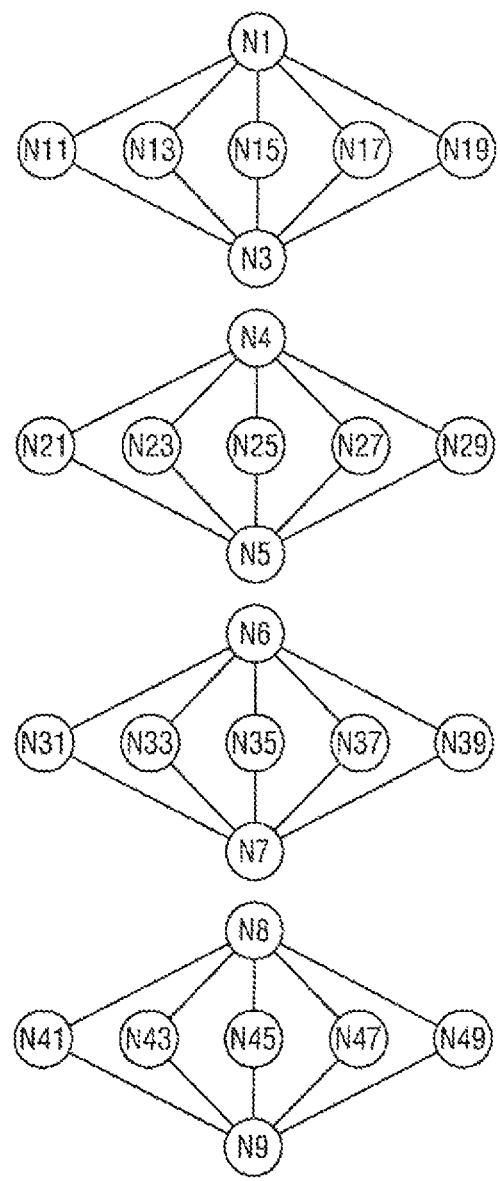
FIG. 5 is a diagram illustrating splitting a graph by the layout decomposition method according to example embodiments of the present inventive concepts.

FIG. 5 is a diagram illustrating splitting a graph by the layout decomposition method according to example embodiments of the present inventive concepts.

Referring to FIG. 5, the graph split module 120 may analyze the graph built by the graph build module 110 and may identify a node, a degree of which exceeds a predetermined reference value. For example, in the case that the predetermined reference value is 5, the graph split module 120 may analyze the graph shown in FIG. 4 and may identify nodes, degrees of which exceed 5, that is, nodes N3, N5 and N7. The nodes identified in the specification are also referred to as target nodes.

In some example embodiments of the present inventive concepts, the graph split module 120 may create a list of the identified nodes, but the scope of the present inventive concepts is not limited thereto. The graph split module 120 may create, for example, information on nodes identified as a data file able to be manipulated by a computer or software having a specific data structure. For example, the graph split module 120 may compare the number of edges connected to the nodes with a predetermined reference value while traversing the graph and may store identification information of a node, a degree of which exceeds the predetermined reference value, for example, identifier or index information of the node, in the data structure.

Then, the graph split module 120 may identify the plurality of subgraphs based on the identified nodes on the basis of the list of the identified nodes, that is, the target nodes. For example, in the case that the nodes N3, N5 and N7 are identified as target nodes in the graph illustrated in FIG. 4, the nodes N4, N6 and N8 corresponding to the nodes N3, N5 and N7 may be additionally created as in FIG. 5. Then, the graph split module 120 may identify a subgraph including the nodes N1 and N3, a subgraph including the nodes N4 and N5, a subgraph including the nodes N6 and N7, and a subgraph including the nodes N8 and N9. Information regarding the subgraphs identified in such a manner may be stored in a memory 30 and/or the storage 20 as data capable of being manipulated by a computer or software.

In some example embodiments of the present inventive concepts, after the graph split module 120 may compare the respective nodes with the list of the target nodes and create the additional nodes (for example, the nodes N4, N6 and N8) corresponding to the target nodes when corresponding nodes correspond to the target nodes, the graph split module 120 may split the graph to thereby create the plurality of subgraphs.

The decomposition module 130 may perform MPT decomposition on each of the plurality of subgraphs created by the graph split module 120 to acquire a plurality of coloring results and may combine the plurality of coloring results to complete coloring on the entirety of the graph. In addition, the decomposition module 130 may classify a plurality of polygons of the layout design into a plurality groups according to colors imparted to the nodes of the graph.

Further, the decomposition module 130 may create first mask layout data corresponding to a layout design including a plurality of polygons classified as a first group and second mask layout data corresponding to a layout design including a plurality of polygons classified as a second group. In some example embodiments, the decomposition module 130 may store the first mask layout data and the second mask layout data in a temporary computer-readable medium. In other embodiments of the present inventive concepts, the decomposition module 130 may store the first mask layout data and the second mask layout data in a non-transitory computer-readable medium. The first mask layout data and the second mask layout data stored in the non-transitory computer-readable medium may be fabricated as a first mask and a second mask used in MPT lithography.

In some example embodiments of the present inventive concepts, performing MPT decomposition on a first subgraph and performing MPT decomposition on a second subgraph may be processed in a parallel manner. For example, MPT decomposition on the first subgraph may be performed by a first thread (or process) and MPT decomposition on the second subgraph may be performed by a second thread. In addition, for example, the first thread may be executed on a first processing unit and the second thread may be executed on a second processing unit. Here, the processing units may include a multiprocessor, a multicore, a heterogeneous multiprocessor and the like.

The number of cases for coloring may be re-calculated as follows. Since the graph is split into four subgraphs by the graph split module 120 and the decomposition module 130 performs coloring on each of the subgraphs, in the case that three types of colors are imparted to the graph shown in FIG. 5, calculation is made as follows.

$Pn = 4 \times (3 \times (3-1)^{7-1}) = 768$

That is, it can confirmed that time required for coloring is remarkably reduced by the layout decomposition method and the layout decomposition system according to the example embodiments of the present inventive concepts.

Figure 6:
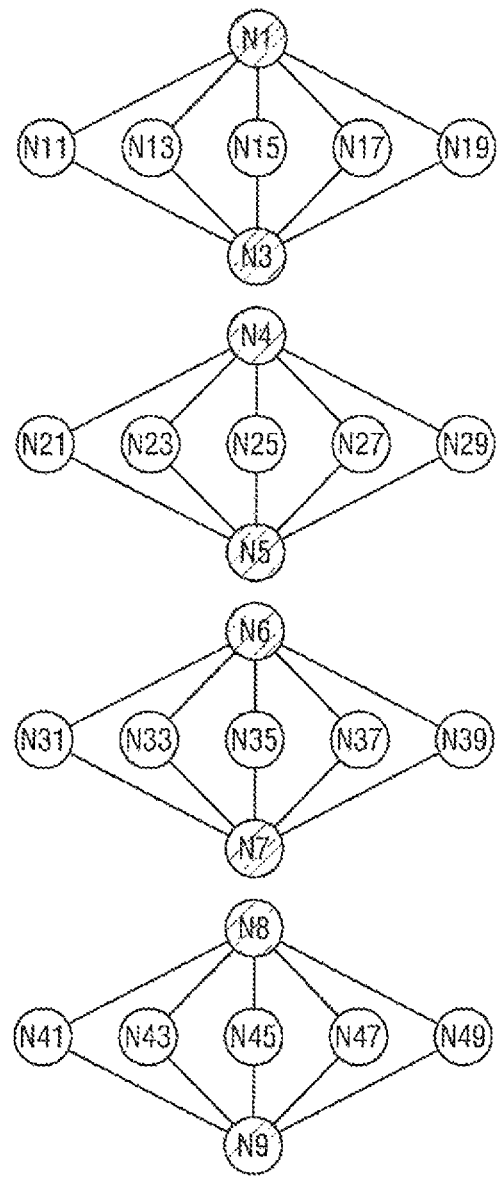
FIG. 6 is a diagram illustrating performing coloring on a graph by a layout decomposition method according to other example embodiments of the present inventive concept.

FIG. 6 is a diagram illustrating performing coloring on a graph by a layout decomposition method according to other example embodiments of the present inventive concepts.

Referring to FIG. 6, the example embodiments of FIG. 6 are different from those of FIG. 5 in that the graph split module 120 imparts a common color to the entirety of the target nodes (that is, the nodes N3, N5 and N7) included in four subgraphs and replicating nodes thereof N4, N6, and N8.

In this manner, in the case that colors of the target nodes are fixed to a single color, the number of cases for coloring may be further reduced. For example, in the case that 3 types of colors are imparted to the graph illustrated in FIG. 6, calculation is made as follows.

$Pn = 4 \times 2 = 8$

That is, since the number of cases for performing coloring on each of four subgraphs is only 2, it can confirmed that time required for coloring is remarkably reduced by the layout decomposition methods and the layout decomposition systems according to the example embodiments of the present inventive concepts.

Figure 7:
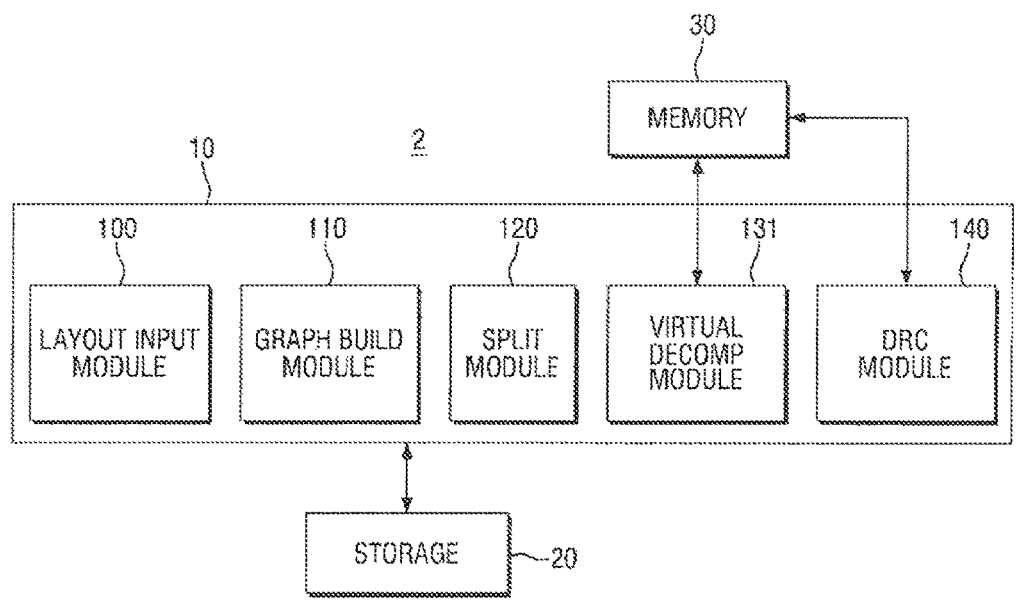
FIG. 7 is a diagram illustrating a layout decomposition system according to other example embodiments of the present inventive concepts.

FIG. 7 is a diagram illustrating a layout decomposition system according to other example embodiments of the present inventive concepts.

Referring to FIG. 7, a layout decomposition system 10 according to other example embodiments of the present inventive concepts may be different from the example embodiments of FIG. 1 in terms of including a virtual decomposition module 131 instead of the decomposition module 130 as well as in terms of further including a design rule check (DRC) module 140. Here, the DRC module 140 may perform an additional design rule check (DRC) on the layout design.

The virtual decomposition module 131 may operate in a process of designing a circuit and may virtually perform graph decomposition from the layout design. A result obtained by virtually performing graph decomposition may be temporarily stored in the memory 30 and subsequently, may be subjected to a process of inspecting the layout design for constraint conditions such as distance errors by the DRC module 140, thereby being converted into signoff data.

Figure 8:
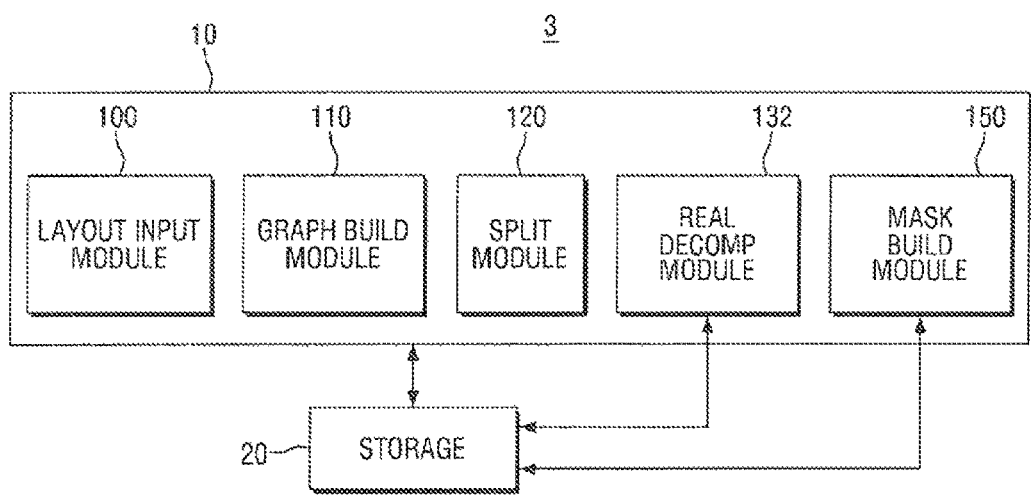
FIG. 8 is a diagram illustrating a layout decomposition system according to other example embodiments of the present inventive concepts.

FIG. 8 is a diagram illustrating a layout decomposition system according to other example embodiments of the present inventive concepts.

Referring to FIG. 8, the layout decomposition system 10 according to other example embodiments of the present inventive concepts may be different from the example embodiments of FIG. 7 in terms of including a real decomposition module 132 instead of the virtual decomposition module 131 as well as in terms of further including a mask build module 150. Here, the mask build module 150 may build a plurality of MPT lithography masks corresponding to a plurality of groups.

The real decomposition module 132 may operate in a process of mass-producing chips and practically perform graph decomposition from the layout design. A result obtained by practically performing graph decomposition may be stored in a non-transitory computer-readable medium including the storage 20 and subsequently, may be used to build the plurality of MPT lithography masks by the mask build module 150.

Figure 9:
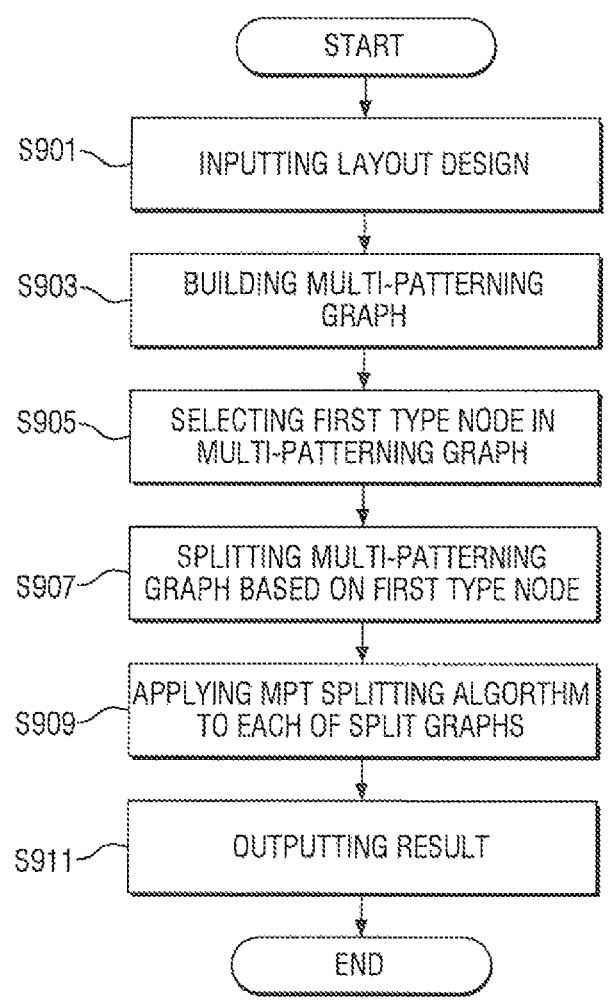
FIG. 9 is a flow chart illustrating the layout decomposition method according to example embodiments of the present inventive concepts.

FIG. 9 is a flow chart illustrating the layout decomposition method according to example embodiments of the present inventive concepts.

Referring to FIG. 9, the layout decomposition method according to example embodiments of the present inventive concepts may perform inputting a layout design (S901), building a graph from a layout design (S903), and selecting a target node in a graph corresponding to the layout design (S905). Then, the method may perform splitting the graph based on the target node (S907), applying MPT splitting algorithm to each of the split graphs (S909) and as a result, outputting separate mask layout data (S911).

Figure 10:
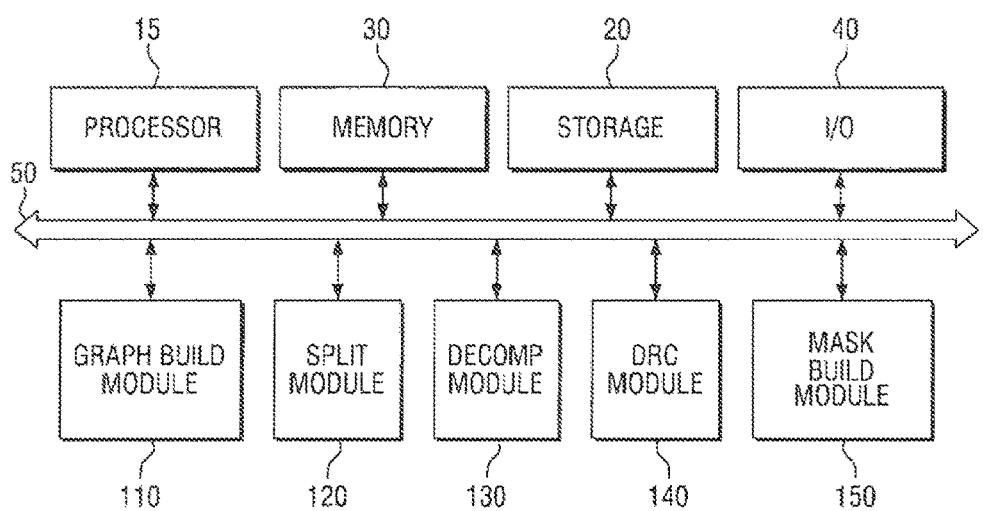
FIG. 10 is a diagram illustrating a semiconductor system implementing a layout decomposition system according to various example embodiments of the present inventive concepts.

FIG. 10 is a diagram illustrating a semiconductor system implementing a layout decomposition system according to various example embodiments of the present inventive concepts.

Referring to FIG. 10, the graph build module 110, the graph split module 120, the decomposition module 130, the DRC module 140 and the mask build module 150 may be electrically connected to a processor 15, the memory 30, the storage 20 and an input/output device 40. The processor 15, the memory 30, the storage 20, the input/output (I/O) device 40, the graph split module 120, the decomposition module 130, the DRC module 140, and the mask build module 150 may receive and transmit data via a bus 50.

While example embodiments have been shown and described above, it will be apparent to those skilled in the art that modifications and variations could be made without departing from the spirit and scope of the present inventive concepts as defined by the appended claims.

What is claimed is:

1. A layout decomposition method comprising:
    building a graph including a plurality of nodes and a plurality of edges from a layout design including a plurality of polygons, wherein respective nodes of the plurality of nodes correspond to respective polygons of the plurality of polygons of the layout design and respective edges of the plurality of edges identify two nodes disposed close to each other at a distance less than a predetermined minimum distance among the plurality of nodes;
    comparing a degree of the respective nodes of the plurality of nodes to a predetermined reference value, wherein the degree of the respective nodes corresponds to a number of edges connected thereto;
    selecting a target node, the degree of which exceeds the predetermined reference value, from among the plurality of nodes;
    identifying a first subgraph and a second subgraph based on the target node, from the graph;
    performing multi-patterning technology (MPT) decomposition on each of the first subgraph and the second subgraph to acquire a first decomposition result and a second decomposition result;
    creating first mask layout data corresponding to a first portion of the layout design and second mask layout data corresponding to a second portion of the layout design by combining the first decomposition result and the second decomposition result; and
    performing an MPT lithography process on a semiconductor wafer using the first mask layout data corresponding to the first portion of the layout design and the second mask layout data corresponding to the second portion of the layout design.

2. The layout decomposition method of claim 1, wherein the performing of the MPT decomposition on each of the first subgraph and the second subgraph comprises:

imparting different colors to a first node and a second node sharing a common edge in the first subgraph; and imparting different colors to a third node and a fourth node sharing a common edge in the second subgraph.

3. The layout decomposition method of claim 2, wherein the performing of the MPT decomposition on each of the first subgraph and the second subgraph comprises:

imparting a first color to the target node included in the first subgraph; and imparting a second color to the target node included in the second subgraph.

4. The layout decomposition method of claim 2, wherein the performing of the MPT decomposition on each of the first subgraph and the second subgraph comprises:

imparting a common color to the target node included in the first subgraph and the target node included in the second subgraph.

5. The layout decomposition method of claim 1, wherein the identifying of the first subgraph and the second subgraph based on the target node comprises storing the identified first subgraph and second subgraph in a memory and/or storage.

6. The layout decomposition method of claim 1, wherein the creating of the first mask layout data corresponding to a first portion of the layout design and the second mask layout data corresponding to a second portion of the layout design by combining the first decomposition result and the second decomposition result comprises storing the first mask layout data and the second mask layout data in a temporary computer-readable medium.

7. The layout decomposition method of claim 1, wherein the creating of the first mask layout data corresponding to a first portion of the layout design and the second mask layout data corresponding to a second portion of the layout design by combining the first decomposition result and the second decomposition result comprises storing the first mask layout data and the second mask layout data in a non-transitory computer-readable medium.

8. The layout decomposition method of claim 7, further comprising:

forming a first mask and a second mask using the first mask layout data and the second mask layout data stored in the non-transitory computer-readable medium.

9. The layout decomposition method of claim 1, wherein the performing of the MPT decomposition on each of the first subgraph and the second subgraph comprises performing the MPT decomposition on the first subgraph in parallel with performing the MPT decomposition on the second subgraph.

10. The layout decomposition method of claim 9, wherein the MPT decomposition is performed on the first subgraph by a first thread and the MPT decomposition is performed on the second subgraph by a second thread.

11. The layout decomposition method of claim 10, wherein the first thread is executed on a first processing unit and the second thread is executed on a second processing unit.

12. A layout decomposition method comprising:

building a graph including a plurality of nodes and a plurality of edges from a layout design including a plurality of polygons, wherein respective nodes of the plurality of nodes correspond to respective polygons of the plurality of polygons of the layout design and respective edges of the plurality of edges identify two nodes disposed close to each other at a distance less than a predetermined minimum distance among the plurality of nodes;

selecting a target node, a degree of which exceeds a predetermined reference value, from among the plurality of nodes, wherein the degree of the target node corresponds to a number of edges connected thereto;

generating an additional node corresponding to the target node;

generating a first subgraph and a second subgraph by separating between the target node and the additional node in the graph;

performing multi-patterning technology (MPT) decomposition on the first subgraph in parallel with performing MPT decomposition on the second sub rash to generate a first decomposition result and a second decomposition result;

forming a first mask and a second mask for performing an MPT lithography process using the first decomposition result of the MPT decomposition on the first subgraph and the second decomposition result of the MPT decomposition on the second subgraph; and performing the MPT lithography process on a semiconductor wafer using the first mask and the second mask.

13. A layout decomposition method comprising:

fetching a layout design including a plurality of polygons from a non-transitory computer-readable medium;

building a graph including a plurality of nodes and a plurality of edges from the layout design to store the graph in a memory, wherein respective nodes of the plurality of nodes correspond to respective polygons of the plurality of polygons of the layout design and respective edges of the plurality of edges identify two nodes disposed close to each other at a distance less than a predetermined minimum distance among the plurality of nodes;

analyzing the graph to create a list of nodes, degrees of which exceed a predetermined reference value, wherein the degrees of the respective nodes correspond to a number of edges connected thereto;

splitting the graph into a plurality of subgraphs based on the list of nodes;

performing multi-patterning technology (MPT) decomposition on subgraphs of the plurality of subgraphs to acquire a plurality of coloring results;

performing coloring on the graph by combining the plurality of coloring results;

classifying the plurality of polygons into a plurality of groups according to colors imparted to the plurality of nodes of the graph, wherein the plurality of groups correspond to a plurality of MPT lithography masks; and performing an MPT lithography process on a semiconductor wafer using the plurality of MPT lithography masks.

14. The layout decomposition method of claim 13, wherein the analyzing of the graph to create the list of nodes, the degrees of which exceed the predetermined reference value, comprises traversing the graph to create the list of nodes, the degrees of which exceed the predetermined reference value.

15. The layout decomposition method of claim 14, wherein the splitting the graph into the plurality of subgraphs based on the list of nodes comprises traversing the graph to compare the respective nodes of the graph with the list of nodes.

16. The layout decomposition method of claim 13, wherein the performing of the MPT decomposition on the subgraphs of the plurality of subgraphs to acquire the plurality of coloring results comprises:

imparting different colors to two nodes sharing a common edge in the subgraphs of the plurality of subgraphs; and acquiring corresponding results of nodes of the plurality of subgraphs and the colors imparted to the nodes of the plurality of subgraphs as the coloring results.

17. The layout decomposition method of claim 16, wherein the imparting of different colors to two nodes sharing, a common edge in the subgraphs of the plurality of subgraphs comprises imparting a common color to nodes included in the list of nodes among the nodes of the plurality of subgraphs.

18. The layout decomposition method of claim 13, wherein the plurality of subgraphs comprises a first subgraph and a second subgraph, wherein the performing of the MPT decomposition on the subgraphs of the plurality of subgraphs to acquire the plurality of coloring results comprises:

performing MPT decomposition on the first subgraph using a first processing unit and storing an acquired first coloring result in a first memory region; and performing MPT decomposition on the second subgraph using a second processing unit operating in parallel with the first processing unit and storing an acquired second coloring, result in a second memory region, and wherein the performing of coloring on the graph by combining the plurality of coloring, results comprises:

reading the first coloring result stored in the first memory region and the second coloring result stored in the second memory region; and storing results of coloring performed on the graph in a third memory region by combining the read first coloring result and the read second coloring result.

19. The layout decomposition method of claim 13, further comprising:

after the classifying of the plurality of polygons into the plurality of groups according to the colors imparted to the plurality of nodes of the graph, performing an additional design rule check (DRC) on the layout design; and storing the layout design, the DRC of which has been completed, in a non-transitory computer-readable medium, as a layout data file.

20. The layout decomposition method of claim 19, wherein respective polygons of the plurality of polygons included in respective groups of the plurality of groups correspond to patterns of respective MPT lithography masks of the plurality of MPT lithography masks.

* * * * *